(12) United States Patent
Kwon et al.

(10) Patent No.: US 9,123,817 B2
(45) Date of Patent: Sep. 1, 2015

(54) TRANSISTORS AND ELECTRONIC DEVICES INCLUDING THE SAME

(75) Inventors: Dae-woong Kwon, Seoul (KR); Jae-chul Park, Suwon-si (KR); Byung-gook Park, Seoul (KR); Sang-wan Kim, Seoul (KR); Jang-hyun Kim, Seoul (KR); Ji-soo Chang, Seoul (KR)

(73) Assignees: Samsung Electronics Co., Ltd., Gyeonggi-do (KR); SNU R&DB Foundation, Seoul (KR)

( * ) Notice: Subject to any disclaimer, the term of this patent is extended or adjusted under 35 U.S.C. 154(b) by 255 days.

(21) Appl. No.: 13/096,314

(22) Filed: Apr. 28, 2011

(65) Prior Publication Data

US 2012/0085998 A1    Apr. 12, 2012

(30) Foreign Application Priority Data

Oct. 12, 2010 (KR) ........................ 10-2010-0099542

(51) Int. Cl.
*H01L 29/78* (2006.01)
*H01L 29/786* (2006.01)

(52) U.S. Cl.
CPC .................................. *H01L 29/7869* (2013.01)

(58) Field of Classification Search
None
See application file for complete search history.

(56) References Cited

U.S. PATENT DOCUMENTS

| | | | | |
|---|---|---|---|---|
| 2003/0047785 A1* | 3/2003 | Kawasaki et al. | ............. | 257/350 |
| 2004/0113229 A1* | 6/2004 | Gonzalez et al. | ............. | 257/509 |
| 2006/0009044 A1* | 1/2006 | Igeta et al. | .................... | 438/778 |
| 2007/0072439 A1* | 3/2007 | Akimoto et al. | .............. | 438/795 |
| 2008/0093595 A1* | 4/2008 | Song et al. | ....................... | 257/43 |
| 2008/0237687 A1* | 10/2008 | Kim et al. | ..................... | 257/316 |
| 2008/0251836 A1* | 10/2008 | Park | .............................. | 257/324 |
| 2009/0073158 A1* | 3/2009 | Kataoka et al. | .............. | 345/212 |
| 2009/0278120 A1* | 11/2009 | Lee et al. | ......................... | 257/43 |
| 2009/0305461 A1* | 12/2009 | Akimoto et al. | ............. | 438/104 |
| 2009/0321732 A1* | 12/2009 | Kim et al. | ........................ | 257/43 |
| 2010/0035379 A1* | 2/2010 | Miyairi et al. | ................ | 438/104 |
| 2010/0059744 A1* | 3/2010 | Yin et al. | ......................... | 257/43 |
| 2011/0180802 A1* | 7/2011 | Morosawa et al. | ............ | 257/59 |

FOREIGN PATENT DOCUMENTS

| | | | |
|---|---|---|---|
| JP | 07-162009 | * | 6/1995 |
| JP | 07162009 A | | 6/1995 |
| JP | 9-102621 | | 4/1997 |
| JP | 2003-298078 | | 10/2003 |
| JP | 2008-192764 | | 8/2008 |
| JP | 2009-200419 | | 9/2009 |
| KR | 100170670 | | 10/1998 |
| KR | 100602259 | | 7/2006 |
| KR | 100633810 A | | 10/2006 |
| KR | 100637204 A | | 10/2006 |
| KR | 100730141 | | 6/2007 |
| WO | PCT/JP2009/067492 | * | 4/2010 |

* cited by examiner

*Primary Examiner* — Fei Fei Yeung Lopez
(74) *Attorney, Agent, or Firm* — Harness, Dickey & Pierce, P.L.C.

(57) ABSTRACT

Example embodiments disclose transistors and electronic devices including the transistors. A transistor may include a charge blocking layer between a gate insulating layer and a gate. An energy barrier between the gate insulating layer and the gate may be increased by the charge blocking layer. The transistor may be an oxide transistor including a channel layer formed of an oxide semiconductor.

23 Claims, 7 Drawing Sheets

< COMPARATIVE EXAMPLE >

< COMPARATIVE EXAMPLE >

< COMPARATIVE EXAMPLE >

# TRANSISTORS AND ELECTRONIC DEVICES INCLUDING THE SAME

CROSS-REFERENCE TO RELATED APPLICATIONS

This application claims priority under 35 U.S.C. §119 to Korean Patent Application No. 10-2010-0099542, filed on Oct. 12, 2010, in the Korean Intellectual Property Office, the entire contents of which are incorporated herein by reference.

BACKGROUND

1. Field

The present disclosure relates to transistors and electronic devices including the transistors.

2. Description of the Related Art

Transistors are widely used as switching devices or driving devices in electronic devices. In particular, since thin film transistors may be formed on glass substrates or plastic substrates, they are generally used in the field of flat panel display devices, such as liquid crystal display devices, organic light emitting display devices, or the like.

In order to improve operating characteristics of a transistor, a method to use an oxide layer having a high carrier mobility as a channel layer has been attempted. This method is mostly applied to a thin film transistor for a flat panel display device.

However, characteristics of a transistor having an oxide layer as a channel layer may not be constantly maintained since the oxide layer is sensitive to light. In particular, since a transistor used in a flat panel display device is simultaneously exposed to both optical stress and electrical stress, the change of the characteristics of the transistor due to the optical and electrical stresses may deteriorate the reliability of the flat panel display device.

SUMMARY

Provided are transistors of which characteristic change due to light or due to optical and electrical stresses is suppressed.

Provided are electronic devices including the transistors.

Additional aspects will be set forth in part in the description which follows and, in part, will be apparent from the description, or may be learned by practice of example embodiments.

According to an aspect of example embodiments, a transistor includes a channel layer including an oxide semiconductor, a source and a drain contacting ends of the channel layer, respectively, a gate corresponding to the channel layer, a gate insulating layer disposed between the channel layer and the gate, and a charge blocking layer disposed between the gate insulating layer and the gate. The charge blocking layer is configured to increase an energy barrier between the gate insulating layer and the gate.

The channel layer may include a ZnO-based oxide.

The ZnO-based oxide may further include at least one of the group consisting of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

For example, the ZnO-based oxide may include hafnium indium zinc oxide (HfInZnO).

The gate insulating layer may include at least one of a silicon oxide layer and a silicon nitride layer.

The gate insulating layer may include a silicon oxide layer and a silicon nitride layer that are sequentially arranged from the channel layer.

The charge blocking layer may include an oxide layer.

The charge blocking layer may include at least one of silicon oxide, aluminum oxide, hafnium oxide, zirconium oxide, yttrium oxide, and tantalum oxide.

The charge blocking layer may have a thickness between about 20 and about 150 nm, for example, between about 50 and about 100 nm.

The gate may be disposed above the channel layer.

The gate may be disposed below the channel layer.

According to another aspect of example embodiments, a flat panel display device includes the transistor.

The flat panel display device may be a liquid crystal display device or an organic light emitting display device.

The transistor may be used as a switching device or a driving device.

According to another aspect of example embodiments, a transistor includes a channel layer including an oxide semiconductor, a source and a drain contacting ends of the channel layer, respectively, a gate corresponding to the channel layer, and a gate insulating layer disposed between the channel layer and the gate, and the gate insulating layer includes a first oxide layer, a nitride layer, and a second oxide layer that are sequentially arranged from the channel layer.

The channel layer may include a ZnO-based oxide.

The ZnO-based oxide may further include at least one of the group consisting of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

For example, the ZnO-based oxide may include hafnium indium zinc oxide (HfInZnO).

The first oxide layer may include silicon oxide.

The nitride layer may include silicon nitride.

The second oxide layer may include at least one of silicon oxide, aluminum oxide, hafnium oxide, zirconium oxide, yttrium oxide, and tantalum oxide.

The second oxide layer may include a material that increases an energy barrier between the nitride layer and the gate.

The first oxide layer may have a thickness between about 20 and about 150 nm, for example, between about 50 and about 100 nm. The nitride layer may have a thickness between about 50 and about 250 nm, for example, between about 100 and about 200 nm. The second oxide layer may have a thickness between about 20 and about 150 nm, for example, between about 50 and about 100 nm.

The gate may be disposed above the channel layer.

The gate may be disposed below the channel layer.

According to another aspect of example embodiments, a flat panel display device includes the transistor.

The flat panel display device may be a liquid crystal display device or an organic light emitting display device.

The transistor may be used as a switching device or a driving device.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1A:
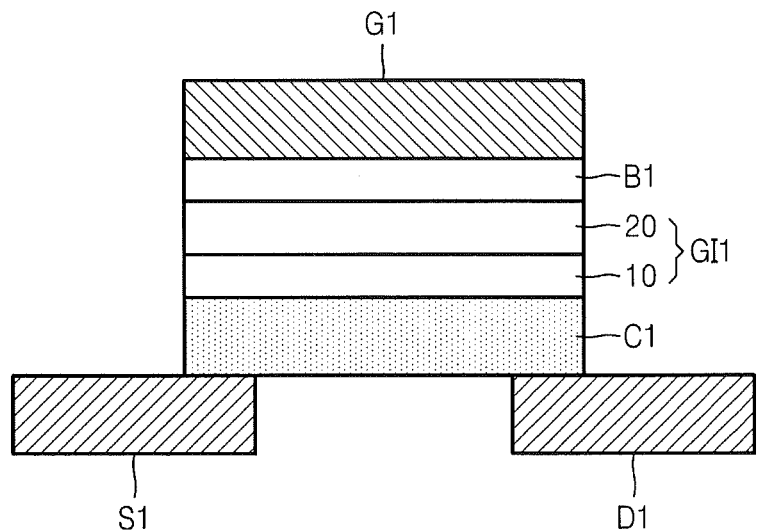
FIGS. 1A-1B are cross-sectional views of transistors according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes," "including," "has," and/or "having," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Reference will now be made in detail to example embodiments, examples of which are illustrated in the accompanying drawings, wherein like reference numerals refer to the like elements throughout. In this regard, example embodiments may have different forms and should not be construed as being limited to the descriptions set forth herein. Accordingly, example embodiments are merely described below, by referring to the figures, to explain aspects of the present description.

FIG. 1A is a cross-sectional view of a transistor according to an example embodiment.

Referring to FIG. 1A, a channel layer C1 including an oxide semiconductor, and a source electrode S1 and a drain electrode D1 respectively contacting ends of the channel layer C1 may be arranged. A gate G1 may be arranged separate from the channel layer C1. A gate insulating layer GI1 may be arranged between the channel layer C1 and the gate G1. A charge blocking layer B1 may be arranged between the gate insulating layer GI1 and the gate G1. The charge blocking layer B1 may include a material that increases an energy barrier between the gate insulating layer GI1 and the gate G1. Due to the charge blocking layer B1, charge movement from the gate G1 to the gate insulating layer GI1 may be suppressed/prevented.

Hereinafter, the aforementioned configuring elements will be further described.

The channel layer C1 may be formed of an oxide semiconductor, for example, a ZnO-based oxide semiconductor. In this case, the ZnO-based oxide semiconductor may include at least one of a transition metal such as hafnium (Hf), yttrium (Y), tantalum (Ta), zirconium (Zr), titanium (Ti), copper (Cu), nickel (Ni) or chromium (Cr), a Group III element such as indium (In), gallium (Ga) or aluminum (Al), a Group IV element such as tin (Sn), a Group II element such as magnesium (Mg) or other elements. In detail, the channel layer C1 may include hafnium indium zinc oxide (HfInZnO), gallium indium zinc oxide (GaInZnO) or the like, for example. The oxide semiconductor that forms the channel layer C1 may be amorphous or crystalline, or may have a mixture structure of amorphous and crystalline phases. However, a material for the channel layer C1 is not limited thereto, and various materials may be used to form the channel layer C1. The channel layer C1 may have a single layer structure or a multi-layer structure.

The source electrode S1 and the drain electrode D1 respectively contacting the ends of the channel layer C1 may be formed of a general electrode material (e.g., a metal, a conductive oxide or the like). For example, the source electrode S1 and the drain electrode D1 may be formed of a metal material including molybdenum (Mo), copper (Cu), titanium (Ti), aluminum (Al) nickel (Ni), tungsten (W), platinum (Pt), or chromium (Cr), of a conductive oxide including IZO (indium zinc oxide), ITO (indium tin oxide), or the like, or may be formed of a metal alloy including two or more different metals. The source electrode S1 and the drain electrode D1 may have a single layer structure or a multi-layer structure including a plurality of different material layers.

Similar to the source electrode S1 and the drain electrode D1, the gate G1 may also be formed of a general electrode material (e.g., a metal, a conductive oxide or the like). For example, the gate G1 may be formed of a metal material including Mo, Cu, Ti, Al, Ni, W, Pt or Cr, of a conductive oxide including IZO, ITO, or the like, or may be formed of a metal alloy including two or more different metals. Also, the gate G1 may have a single layer structure or a multi-layer structure including a plurality of different material layers. The gate G1 may be formed of the same material as the source electrode S1 and the drain electrode D1, or may be formed of a different material from the source electrode S1 and the drain electrode D1.

The gate insulating layer GI1 may have a multi-layer structure including a silicon oxide layer 10 and a silicon nitride layer 20. In this case, the silicon oxide layer 10 and the silicon nitride layer 20 may be sequentially disposed from the channel layer C1. The silicon oxide layer 10 may have a higher quality than that of the silicon nitride layer 20, and may directly contact the channel layer C1. The quality of the silicon oxide layer 10 may be a factor that determines a characteristic of an interface between the channel layer C1 and the gate insulating layer GI1. Since the silicon oxide layer 10 may have a higher quality than that of the silicon nitride layer 20 and may directly contact the channel layer C1, characteristics of the interface between the channel layer C1 and the gate insulating layer GI1 may be improved by the silicon oxide layer 10. The silicon nitride layer 20 has a higher dielectric constant than a dielectric constant of the silicon oxide layer 10, and may function to increase an effective thickness of the gate insulating layer GI1. Also, a deposition speed of the silicon nitride layer 20 may be faster than that of the silicon oxide layer 10, so that a total deposition time of the gate insulating layer GI1 may be reduced by arranging the silicon nitride layer 20. A thickness of the silicon oxide layer 10 may be between about 20 and about 150 nm, in more detail, between about 50 and about 100 nm, and a thickness of the silicon nitride layer 20 may be between about 50 and about 250 nm, in more detail, between about 100 and about 200 nm.

A structure of the gate insulating layer GI1 is an example and thus may vary. For example, the silicon oxide layer 10 may be substituted by another oxide layer, and the silicon nitride layer 20 may be substituted by another nitride layer. Also, the gate insulating layer GI1 may have a single layer structure or a multi-layer structure including three or more layers. In other words, the gate insulating layer GI1 may have a single layer structure or a multi-layer structure including silicon oxide, silicon nitride, silicon oxynitride or various high-k dielectric materials (materials having a greater dielectric constant than silicon nitride).

Figure 1B:
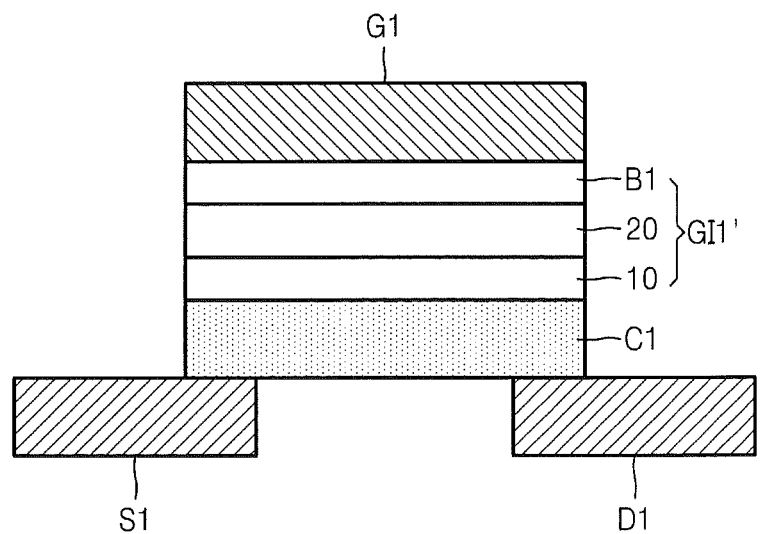

The charge blocking layer B1 may include a material that increases the energy barrier between the gate insulating layer GI1 and the gate C1. The material that increases the energy barrier may be an oxide (insulator). In more detail, the charge blocking layer B1 may include at least one selected from the group consisting of silicon oxide ($SiO_2$), aluminum oxide ($Al_2O_3$), hafnium oxide ($HfO_2$), zirconium oxide ($ZrO_2$), yttrium oxide ($Y_2O_3$), and tantalum oxide ($Ta_2O_5$). The charge blocking layer B1 is an insulator and is arranged between the channel layer C1 and the gate G1, so that the charge blocking layer B1 may be regarded as a portion of a gate insulating layer GI1', as shown in FIG. 1B. It should be understood that the transistor of FIG. 1B is the same as the transistor in FIG. 1A except that the gate insulating layer GI1' includes the charge blocking layer B1. Thus, for the sake of brevity and clarity, FIG. 1A will be described. That is, it is possible to state that the silicon oxide layer 10, the silicon nitride layer 20, and the charge blocking layer B1 form a gate insulating layer. If the charge blocking layer B1 is formed of silicon oxide, the silicon oxide layer 10, the silicon nitride layer 20, and a silicon oxide layer (i.e., the charge blocking layer B1) that are sequentially stacked may form a gate insulating layer (oxide/nitride/oxide structure). A thickness of the charge blocking layer B1 may be between about 20 and about 150 nm, in more detail, between about 50 and about 100 nm.

The energy barrier between the gate insulating layer GI1 and the gate G1, that is, the energy barrier between the gate G1 and the silicon nitride layer 20 is increased by the charge blocking layer B1, so that charge movement from the gate G1 to the gate insulating layer GI1 may be suppressed/prevented. In this regard, the transistor according to the present example embodiment may have excellent optoelectric reliability, which will be further described later.

Although not illustrated in FIGS. 1A-1B, a passivation layer may be further arranged to cover the channel layer C1, the source electrode S1, the drain electrode D1, the gate insulating layer GI1, the charge blocking layer B1, and the gate G1. The passivation layer may have a structure in which one or more of a silicon oxide layer, a silicon nitride layer, and an organic layer are stacked.

The transistor of FIG. 1A has a top gate structure in which the gate G1 is arranged above the channel layer C1. However, a transistor according to another example embodiment may have a bottom gate structure in which the gate G1 is arranged below the channel layer C1.

Figure 2:
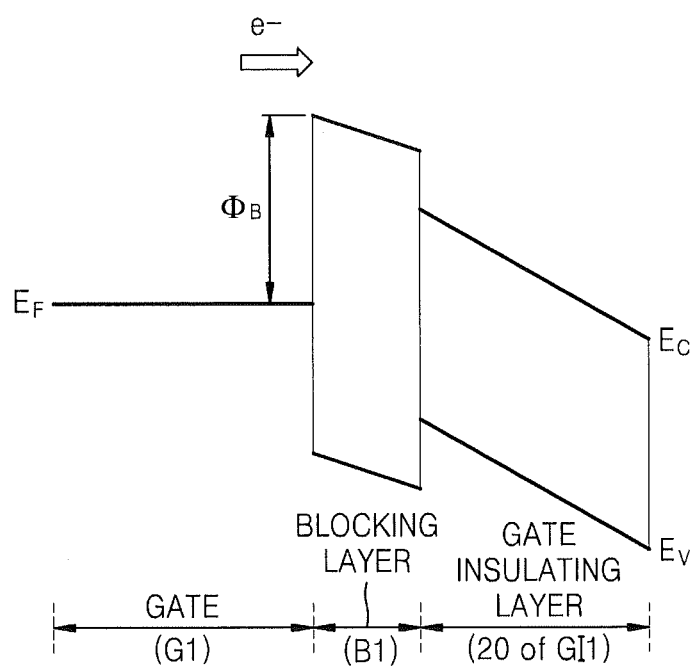
FIG. 2 illustrates an energy band diagram of a gate, a charge blocking layer, and a gate insulating layer in the transistor of FIG. 1A according to an example embodiment.

FIG. 2 illustrates an example energy band diagram of a portion of the transistor of FIG. 1A, that is, the gate C1, the charge blocking layer B1, and a portion of the gate insulating layer GI1 (i.e., the silicon nitride layer 20). In FIG. 2, reference symbols $E_C$ and $E_V$ indicate a lowest energy level of a conduction band, and a highest energy level of a valence band, respectively, and a reference symbol $E_F$ indicates a Fermi energy level. These indications are the same in FIG. 4.

Referring to FIG. 2, $E_C$ of the charge blocking layer B1 is greater than $E_C$ of the gate insulating layer GI1 (the silicon nitride layer 20). The charge blocking layer B1 functions to increase an energy barrier between the gate G1 and the gate insulating layer GI1 (the silicon nitride layer 20). A reference symbol $\phi_B$ indicates an energy barrier formed between the gate G1 and the gate insulating layer GI1 (the silicon nitride layer 20) by the charge blocking layer B1. The energy barrier $\phi_B$ may function to suppress a flow of electrons e– that move from the gate G1 to the gate insulating layer GI1 (the silicon nitride layer 20). When charges (electrons e–) move from the gate G1 to the gate insulating layer GI1 (the silicon nitride layer 20) by an optical stress or an optical/voltage stress, and the charges (electrons e–) are trapped, characteristics including a threshold voltage of the transistor may be changed. When the charge blocking layer B1 is not provided, an energy barrier between the gate G1 and the gate insulating layer GI1 (the silicon nitride layer 20) is relatively low such that change in the characteristics of the transistor may easily occur due to the optical stress and/or voltage stress. In particular, light having a short wavelength equal to or less than about 500 nm has an intense energy, so that the light may easily cause the change in the characteristics of the transistor. In more detail, in a case where the charge blocking layer B1 is not arranged and the gate G1 is formed of Mo, an energy barrier between the gate G1 and the silicon nitride layer 20 may be about 3 eV, and since light (e.g., blue light) having a wavelength equal to or less than about 500 nm may have an intense energy greater than 3 eV, movement (injection) and trap of charges may easily occur due to the light such that characteristics of the transistor may be changed. However, according to the present example embodiment, the high energy barrier $\phi_B$ is formed between the gate G1 and the gate insulating layer GI1 (the silicon nitride layer 20) by the charge blocking layer B1, movement (injection) and trap of charges may be suppressed/prevented. Thus, the change in the characteristics of the transistor due to the optical stress or optical/voltage stress may be suppressed/prevented. When the charge blocking layer B1 is formed as a silicon oxide ($SiO_2$) layer, the energy barrier $\phi_B$ may be equal to or greater than about 4 eV. Besides the silicon oxide ($SiO_2$) layer, aluminum oxide ($Al_2O_3$), hafnium oxide ($HfO_2$), zirconium oxide ($ZrO_2$), yttrium oxide ($Y_2O_3$) or tantalum oxide ($Ta_2O_5$) may form a high energy barrier $\phi_B$ between the gate G1 and the gate insulating layer GI1 (the silicon nitride layer 20).

Figure 3:
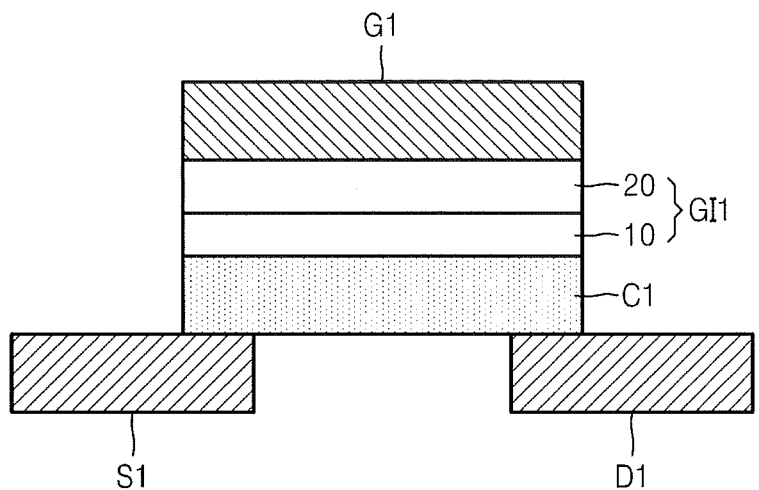
FIG. 3 is a cross-sectional view of a transistor according to a comparative example.

FIG. 3 is a cross-sectional view of a transistor according to a comparative example.

Referring to FIG. 3, the transistor according to the comparative example has a structure in which the charge blocking layer B1 of FIG. 1A is not arranged. Thus, a silicon nitride layer 20 of a gate insulating layer GI1 directly contacts a gate G1. Except for the fact that the charge blocking layer B1 is not arranged, the structure of the transistor according to the comparative example may be the same as that of the transistor shown in FIG. 1A.

Figure 4:
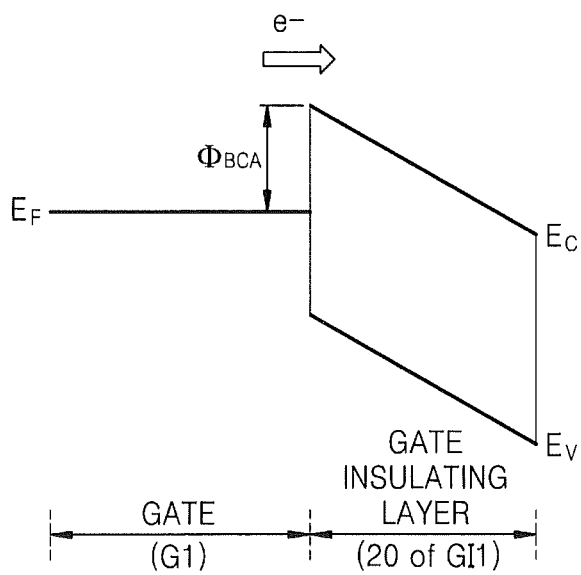
FIG. 4 illustrates an energy band diagram of a gate and a gate insulating layer in the transistor of FIG. 3.

FIG. 4 illustrates an energy band diagram of a portion of the transistor of FIG. 3, that is, the gate G1 and a portion of the gate insulating layer GI1 (i.e., the silicon nitride layer 20).

Referring to FIG. 4, an energy barrier $\phi_{BCA}$ between the gate G1 and the gate insulating layer GI1 (the silicon nitride layer 20) is less than that of FIG. 2. As described above, when the gate G1 is formed of Mo, the energy barrier $\phi_{BCA}$ between the gate G1 and the gate insulating layer GI1 (the silicon nitride layer 20) may be about 3 eV.

Figure 5:
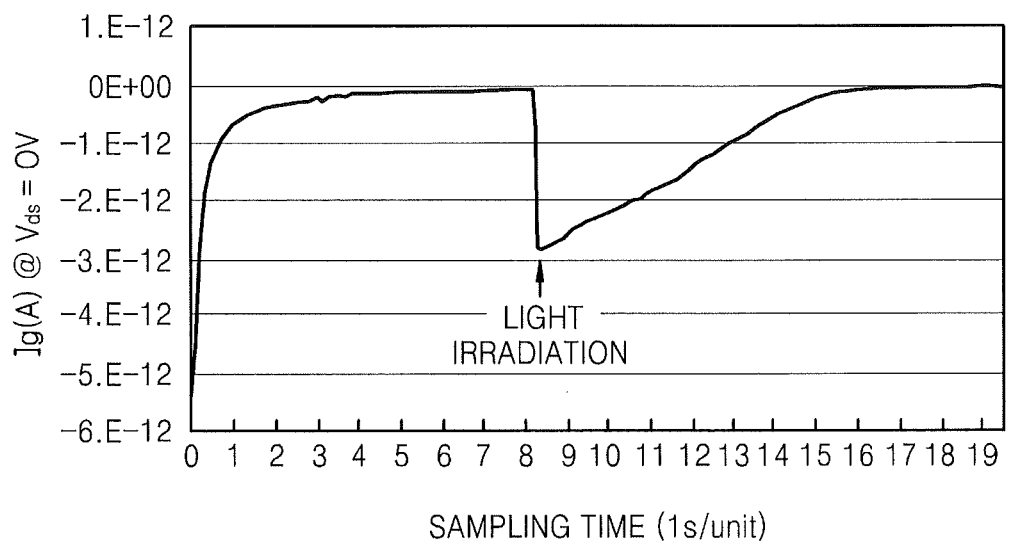
FIG. 5 is a graph illustrating variation of gate current in the transistor according to the comparative example due to light irradiation.

FIG. 5 is a graph illustrating variation of gate current Ig in a transistor (e.g., the transistor of FIG. 3) according to the comparative example due to light irradiation. The transistor according to a comparative example that is used to obtain the result of the graph of FIG. 5 has the structure shown in FIG. 3. Here, a channel layer is formed as a HfInZnO layer, and a gate is formed as an Mo layer. Also, a gate insulating layer is formed as a double-layer including SiOx and SiNx layers. A voltage of –20 V is applied to the gate, and a voltage of 0 V is applied to a source electrode and a drain electrode.

Referring to FIG. 5, when light (blue light, wavelength: 465 nm, intensity: 8000 cd/$m^2$) is irradiated, the gate current Ig sharply varies. It is assumed that the gate current Ig varies due to the charges (carriers) that move from the gate to the gate insulating layer and then are trapped by the blue light.

Figure 6:
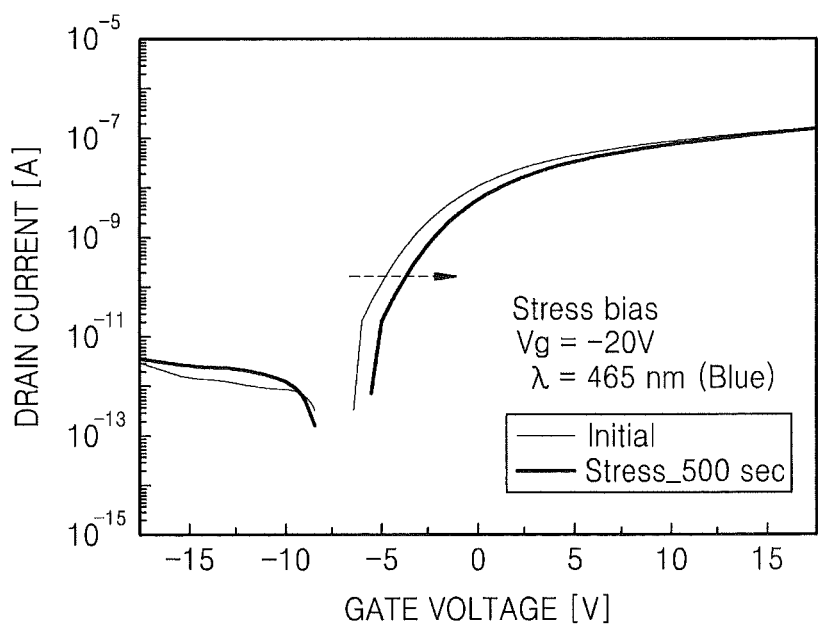
FIG. 6 is a graph illustrating variation of a gate voltage-drain current characteristic of the transistor according to the comparative example due to an optical/voltage stress.

FIG. 6 is a graph illustrating variation of a gate voltage Vgs-drain current Id characteristic of the transistor of FIG. 5 due to an optical/voltage stress. Blue light having an intensity of about 8000 cd/$m^2$ is irradiated to the transistor according to the comparative example, and simultaneously, voltages of –20 V, 0 V, and 0 V are applied to a gate, a source electrode, and a drain electrode, respectively. After 500 seconds, characteristics of the transistor are measured.

Referring to FIG. 6, it can be seen that a gate voltage Vgs-drain current Id graph that is measured after an optical/voltage stress is applied for about 500 seconds is significantly moved rightward, compared to an initial graph, which means that the transistor's characteristics, including a threshold voltage or the like, are changed by the optical/voltage stress.

Figure 7:
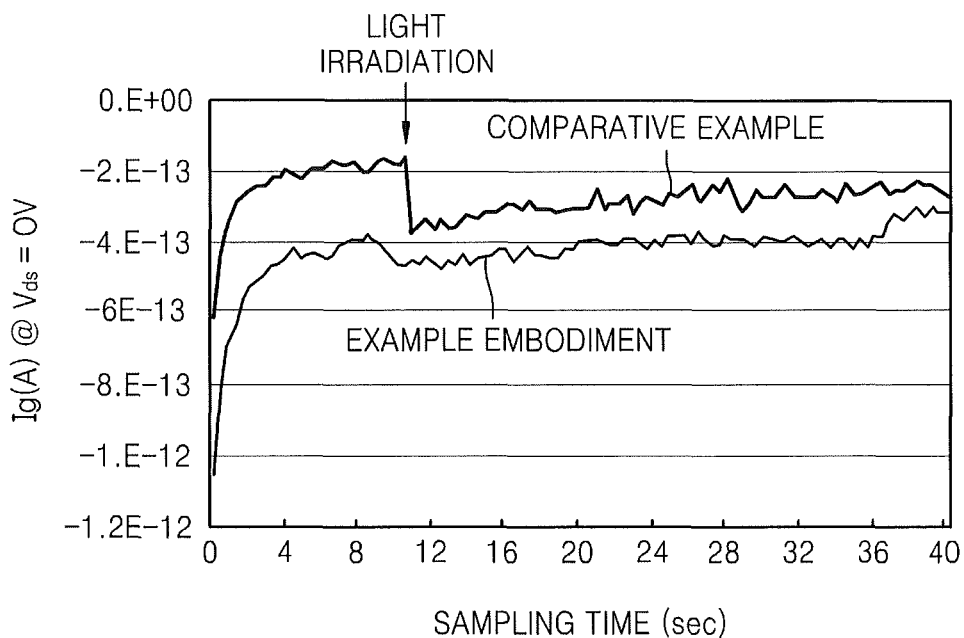
FIG. 7 is a graph illustrating variation of gate current in a transistor according to an example embodiment and in a transistor according to a comparative example due to light irradiation.

FIG. 7 is a graph illustrating variation of gate current Ig in a transistor according to an example embodiment and in a transistor according to a comparative example, due to light irradiation. Here, the transistor according to the example embodiment has a structure shown in FIG. 1A in which a channel layer is formed as a HfInZnO layer, a gate is formed as an Mo layer, a gate insulating layer is formed as a double-layer including SiOx and SiNx layers, and a charge blocking layer is formed as a SiOx layer. Also, the transistor according to the comparative example has a structure shown in FIG. 3, that is, the transistor according to the comparative example has a structure in which a charge blocking layer is not arranged. Except for the fact that the charge blocking layer is not arranged, the transistor according to the comparative example has the same structure as that of the transistor according to the example embodiment. Light having an intensity of about 8000 cd/$m^2$ is irradiated to the transistor according to the example embodiment and the transistor according to the comparative example, respectively, and voltages of –20 V, 0 V, and 0 V are applied to the gate, a source electrode and a drain electrode, respectively, of both transistors.

Referring to FIG. 7, it can be seen that the gate current Ig in the transistor according to the comparative example sharply varies at a point of light irradiation, whereas the gate current Ig in the transistor according to the example embodiment is almost constant at the point of light irradiation, which means that, by using the charge blocking layer B1 as in the example embodiment, charge (carrier) movement from the gate G1 to the gate insulating layer GI1 may be suppressed, so that change in the characteristics of the transistor due to an optical stress or an optical/voltage stress may be suppressed.

Figure 8:
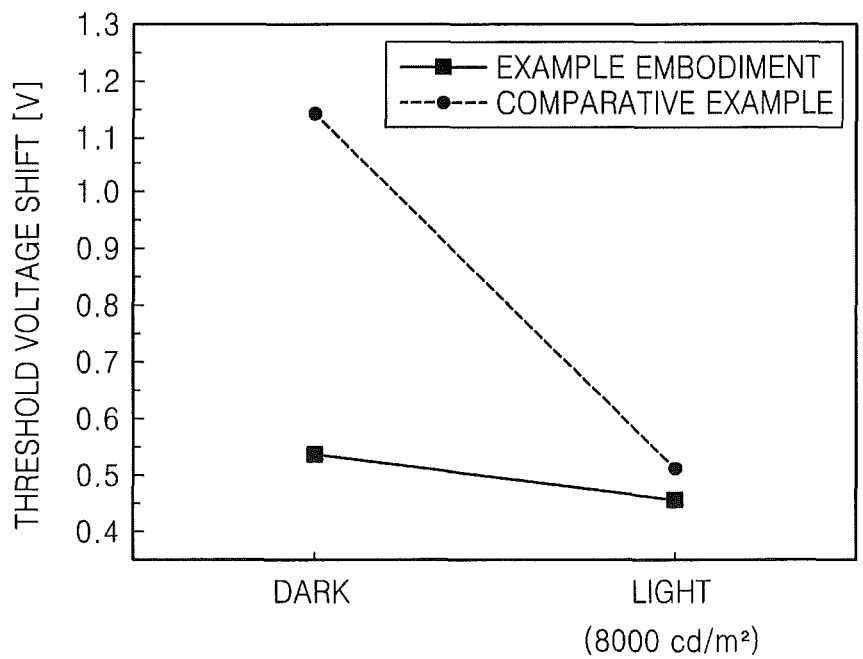
FIG. 8 is a graph illustrating threshold voltage variation in a transistor according to an example embodiment and in a transistor according to a comparative example due to an optical/voltage stress.

FIG. 8 is a graph illustrating threshold voltage variation in a transistor according to an example embodiment and in a transistor according to a comparative example due to an optical/voltage stress. The transistor according to the example embodiment and the transistor according to the comparative example are the same as those of FIG. 7. In the graph of FIG. 8, a part referred to as 'Dark' indicates threshold voltage variation due to an electric stress without light irradiation, and a part referred to as 'Light' indicates threshold voltage variation due to an optical/voltage stress.

Referring to FIG. 8, it can be seen that the amount of threshold voltage variation in the transistor according to the example embodiment is significantly smaller than the amount of threshold voltage variation in the transistor according to the comparative example. That is, in the transistor according to the comparative example, a difference of the threshold voltage variation between a 'Dark' status and a 'Light' status is significantly large, whereas in the transistor according to the example embodiment, a difference of the threshold voltage variation between a 'Dark' status and a 'Light' status is very small.

Referring to the results of FIGS. 7 and 8, the reliability of a transistor may be improved by using the charge blocking layer B1 as in the transistor according to the example embodiment.

Figure 9:
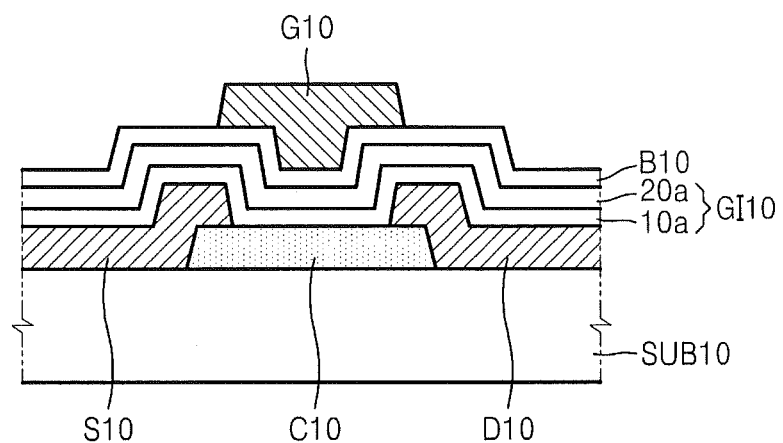
FIGS. 9 through 11 are cross-sectional views of transistors according to example embodiments.
Figure 10:
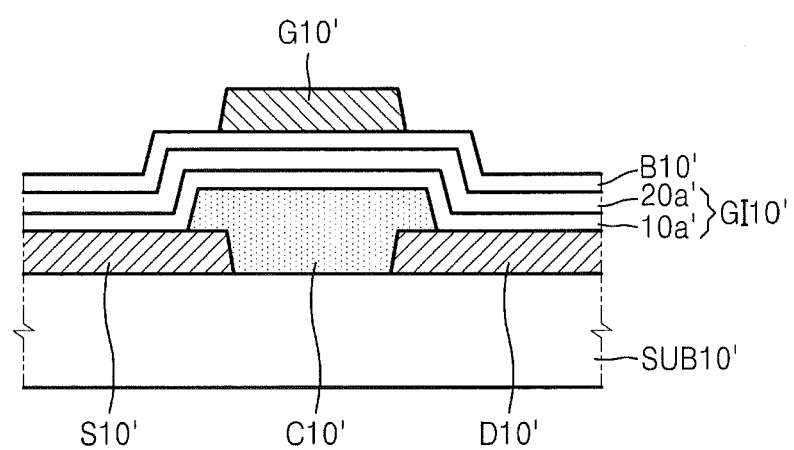
Figure 11:
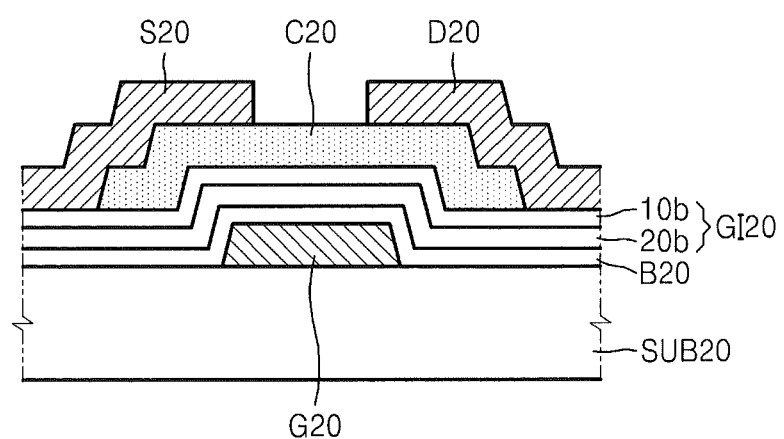

FIGS. 9 through 11 are cross-sectional views of transistors according to example embodiments. FIGS. 9 and 10 illustrate thin film transistors (TFTs) having a top gate structure, and FIG. 11 illustrates a TFT having a bottom gate structure.

Referring to FIG. 9, a channel layer C10 may be arranged on a substrate SUB10. A source electrode S10 and a drain electrode D10, respectively contacting ends of the channel layer C10, may be arranged on the substrate SUB10. A gate insulating layer GI10 may be arranged to cover the channel layer C10, the source electrode S10 and the drain electrode D10. The gate insulating layer GI10 may include a first layer 10a and a second layer 20a that are sequentially stacked. The first layer 10a may include a silicon oxide layer, and the second layer 20a may include a silicon nitride layer. However, the silicon oxide layer and the silicon nitride layer are examples and thus a structure of the gate insulating layer GI10 may vary. Another example of the structure of the gate insulating layer GI10 is the same as that described above with reference to FIG. 1A, and thus descriptions, which are the same as the aforementioned contents, will be omitted. A charge blocking layer B10 may be arranged on the gate insulating layer GI10. A gate G10 may be arranged on the charge blocking layer B10. The gate G10 may be disposed above the channel layer C10. Although not illustrated in FIG. 9, a passivation layer may be arranged on the charge blocking layer B10 so as to cover the gate G10.

Materials and thicknesses of the channel layer C10, the source electrode S10, the drain electrode D10, the gate insulating layer GI10, the charge blocking layer B10, and the gate G10 of FIG. 9 may be the same as (or similar to) those of the channel layer C1, the source electrode S1, the drain electrode D1, the gate insulating layer GI1, the charge blocking layer B1, and the gate G1 of FIG. 1A, respectively. The charge blocking layer B10 may be regarded as a portion of the gate insulating layer GI10.

In the structure of the transistor shown in FIG. 9, the source electrode S10 and the drain electrode D10 contact top surfaces of the ends of the channel layer C10, respectively. However, an arrangement between the channel layer C10 and the source and drain electrodes S10 and D10 may vary, and an example of the variation is shown in FIG. 10.

Referring to FIG. 10, a source electrode S10' and a drain electrode D10' may contact bottom surfaces of ends of a channel layer C10', respectively. That is, the source electrode S10' and the drain electrode D10' may be arranged on a substrate SUB10' separate from each other, and a channel layer C10', contacting an end of each of the source electrode S10' and the drain electrode D10', may be arranged between the source electrode S10' and the drain electrode D10'. In the structure of the transistor shown in FIG. 10, the rest of the structure of FIG. 10 except for an arrangement between the channel layer C10' and the source and drain electrodes S10' and D10' may be similar to that of the structure of the transistor shown in FIG. 9. Reference numerals 10a', 20a', GI10', B10', and G10' indicate a first layer, a second layer, a gate insulating layer, a charge blocking layer, and a gate, respectively.

Referring to FIG. 11, a gate G20 may be arranged on a substrate SUB20. A charge blocking layer B20 may be arranged on the substrate SUB20 so as to cover the gate G20. A material and a thickness of the charge blocking layer B20 may be the same as those of the charge blocking layer B1 of FIG. 1A. A gate insulating layer GI20 may be arranged on the charge blocking layer B20. The gate insulating layer GI20 may include a second layer 20b and a first layer 10b. The second layer 20b and the first layer 10b may be sequentially stacked on the charge blocking layer B20. Here, materials and thicknesses of the first layer 10b and the second layer 20b may be the same as those of the first layer 10a and the second layer 20a of FIG. 9. A structure of the gate insulating layer GI20 may vary. A channel layer C20 may be arranged on the gate insulating layer GI20. The channel layer C20 may be disposed above the gate G20. A width of the channel layer C20 may be somewhat greater than a width of the gate G20. A material forming the channel layer C20 may be the same as a material forming the channel layer C1 of FIG. 1A. A source electrode S20 and a drain electrode D20 respectively contacting ends of the channel layer C20 may be arranged on the gate insulating layer GI20. Although not illustrated in FIG. 11, a passivation layer may be further arranged to cover the channel layer C20, the source electrode S20, and the drain electrode D20.

In the structure of the transistor shown in FIG. 11, the source electrode S20 and the drain electrode D20 contact top surfaces of ends of the channel layer C20, respectively. However, an arrangement between the channel layer C20 and the source and drain electrodes S20 and D20 may vary. Besides of this, the structure of the transistor may be modified in various ways.

A transistor according to the one or more example embodiments may be used as a switching device or a driving device in a flat panel display device including a liquid crystal display device, an organic light emitting display device, or the like. As described above, in the transistor according to the one or more example embodiments, change in the characteristics of the transistor due to light or due to optical and electrical stresses is very small, thus, by applying the transistor to the flat panel display device, the reliability of the flat panel display device may be improved. Since structures of the liquid crystal display device and the organic light emitting display device are well known, detailed descriptions thereof are omitted here. The transistor according to the one or more example embodiments may be widely used not only in flat panel display devices but also in other electronic devices including a memory device, a logic device or the like.

It should be understood that example embodiments described therein should be considered in a descriptive sense only and not for purposes of limitation. For example, it will be obvious to one of ordinary skill in the art that the structure of the transistors shown in FIGS. 1A-1B and FIGS. 9 through 11 may vary. In more detail, the transistor according to one or more example embodiments may have a double gate structure or a multi-channel structure. In addition, it will be obvious to one of ordinary skill in the art that inventive concepts of one or more example embodiments may be applied to not only an oxide TFT but to other transistors. Descriptions of features or aspects within each example embodiment should typically be considered as available for other similar features or aspects in other example embodiments.

What is claimed is:
1. A transistor comprising:
a channel layer including an oxide semiconductor;
a source and a drain contacting ends of the channel layer, respectively;

a gate corresponding to the channel layer;
a gate insulating layer between the channel layer and the gate; and
a charge blocking layer between the gate insulating layer and the gate, the charge blocking layer configured to increase an energy barrier between the gate insulating layer and the gate,
wherein the charge blocking layer includes at least one of hafnium oxide, zirconium oxide, yttrium oxide, and tantalum oxide, the charge blocking layer has a thickness smaller than that of the gate insulating layer,
the gate insulating layer includes a first oxide layer and a nitride layer, the nitride layer contacting the charge blocking layer and the charge blocking layer contacting the gate, the first oxide layer has a thickness greater than 20 nm, and
the transistor is one of a switching transistor and a driving transistor.

2. The transistor of claim 1, wherein the channel layer comprises a ZnO-based oxide.

3. The transistor of claim 2, wherein the ZnO-based oxide comprises at least one of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

4. The transistor of claim 3, wherein the ZnO-based oxide comprises hafnium indium zinc oxide (HfInZnO).

5. The transistor of claim 1, wherein the gate insulating layer comprises at least one of the first oxide layer including a silicon oxide layer and the nitride layer including a silicon nitride layer.

6. The transistor of claim 1, wherein the first oxide layer includes a silicon oxide layer and the nitride layer includes a silicon nitride layer, the silicon oxide layer and the silicon nitride layer are sequentially arranged on the channel layer.

7. The transistor of claim 1, wherein the charge blocking layer has a thickness between about 20 and about 150 nm.

8. The transistor of claim 1, wherein the gate is above the channel layer.

9. The transistor of claim 1, wherein the gate is below the channel layer.

10. A flat panel display device comprising the transistor of claim 1.

11. A transistor comprising:
a channel layer including an oxide semiconductor;
a source and a drain contacting ends of the channel layer, respectively;
a gate corresponding to the channel layer; and
a gate insulating layer between the channel layer and the gate, the gate insulating layer including a first oxide layer, a nitride layer, and a second oxide layer sequentially arranged on the channel layer, the nitride layer contacting the second oxide layer and the second oxide layer contacting the gate,
wherein the second oxide layer includes at least one of hafnium oxide, zirconium oxide, yttrium oxide, and tantalum oxide,
the first oxide layer has a thickness greater than 20 nm, and
the transistor is one of a switching transistor and a driving transistor.

12. The transistor of claim 11, wherein the channel layer comprises a ZnO-based oxide.

13. The transistor of claim 12, wherein the ZnO-based oxide further comprises at least one of hafnium (Hf), yttrium (Y), tantalum (Ta), zirconium (Zr), titanium (Ti), copper (Cu), nickel (Ni), chromium (Cr), indium (In), gallium (Ga), aluminum (Al), tin (Sn), and magnesium (Mg).

14. The transistor of claim 11, wherein the first oxide layer comprises silicon oxide.

15. The transistor of claim 11, wherein the nitride layer comprises silicon nitride.

16. The transistor of claim 11, wherein the second oxide layer comprises a material configured to increase an energy barrier between the nitride layer and the gate.

17. The transistor of claim 11, wherein the first oxide layer has a thickness between about 20 and about 150 nm.

18. The transistor of claim 11, wherein the nitride layer has a thickness between about 50 and about 250 nm.

19. The transistor of claim 11, wherein the second oxide layer has a thickness between about 20 and about 150 nm.

20. The transistor of claim 11, wherein the gate is above the channel layer.

21. The transistor of claim 11, wherein the gate is below the channel layer.

22. A flat panel display device comprising the transistor of claim 11.

23. A transistor comprising:
a channel layer including an oxide semiconductor;
a source and a drain contacting ends of the channel layer, respectively;
a gate corresponding to the channel layer; and
a gate insulating layer between the channel layer and the gate, the gate insulating layer including a first oxide layer, a nitride layer, and a second oxide layer sequentially arranged on the channel layer, the nitride layer contacting the second oxide layer and the second oxide layer contacting the gate,
wherein the second oxide layer has a thickness between 50 nm and 100 nm, and the nitride layer has a thickness greater than those of the first oxide layer and the second oxide layer, wherein the second oxide layer includes at least one of hafnium oxide, zirconium oxide, yttrium oxide, and tantalum oxide,
the first oxide layer has a thickness greater than 20 nm, and
the transistor is one of a switching transistor and a driving transistor.

* * * * *